United States Patent
Zecri et al.

(10) Patent No.: US 7,916,439 B2
(45) Date of Patent: Mar. 29, 2011

(54) SEMICONDUCTOR SWITCH ARRANGEMENT AND AN ELECTRONIC DEVICE

(75) Inventors: Michel Zecri, Bevenais (FR); Luca Bertolini, Toulouse (IT); Patrice Besse, Toulouse (FR); Maryse Bafleur, Castanet Tolosan (FR); Nicolas Nolhier, Espanes (FR)

(73) Assignee: Freescale Semiconductor, Inc., Austin, TX (US)

( * ) Notice: Subject to any disclaimer, the term of this patent is extended or adjusted under 35 U.S.C. 154(b) by 659 days.

(21) Appl. No.: 11/573,078

(22) PCT Filed: Aug. 3, 2005
(Under 37 CFR 1.47)

(86) PCT No.: PCT/EP2005/053819
§ 371 (c)(1),
(2), (4) Date: Mar. 5, 2008

(87) PCT Pub. No.: WO2006/013211
PCT Pub. Date: Feb. 9, 2006

(65) Prior Publication Data
US 2008/0246345 A1    Oct. 9, 2008

(30) Foreign Application Priority Data
Aug. 3, 2004  (EP) ..................... 04103726

(51) Int. Cl.
*H02H 3/22* (2006.01)
(52) U.S. Cl. .......................... 361/56; 361/111
(58) Field of Classification Search .......... 361/56, 361/111; 257/355–360
See application file for complete search history.

(56) References Cited

U.S. PATENT DOCUMENTS

| | | | |
|---|---|---|---|
| 5,812,006 A | 9/1998 | Teggatz et al. | |
| 6,172,383 B1 | 1/2001 | Williams | |
| 6,239,515 B1 | 5/2001 | Mackel et al. | |
| 6,365,932 B1 * | 4/2002 | Kouno et al. | 257/341 |
| 6,614,633 B1 | 9/2003 | Kohno | |
| 7,183,802 B2 * | 2/2007 | Arashima et al. | 326/80 |
| 7,626,243 B2 * | 12/2009 | Disney et al. | 257/546 |

FOREIGN PATENT DOCUMENTS

DE   19922924 A1   11/2000

OTHER PUBLICATIONS

Duvvury et al; "Lateral DMOS Design for ESD Robustness"; IEDM 1997, pp. 375-380.
Tam; "Protected power MOSFET provides safety and low noise features"; PCIM (Power Converters Intel Motion), vol. 24, pp. 38-48, 1998.
Bertrand et al; "Analysis and Compact Modeling of a vertical Grounded-Base N-P-N. Bipolar transistor Used as ESD Protection in a Smart Power technology"; IEEE Journal of Solid-State Circuits, vol. 36, Sep. 2001, pp. 1373-1381.

* cited by examiner

*Primary Examiner* — Danny Nguyen

(57) ABSTRACT

A semiconductor switch arrangement comprises a bipolar transistor and a semiconductor power switch having an input node, an output node and a control node for allowing a current path to be formed between the input node and the output node. The bipolar transistor is coupled between the input node and the control node such that upon receiving an electro-static discharge pulse the bipolar transistor allows a current to flow from the input node to the control node upon a predetermined voltage being exceeded at the input node to allow the control node to cause a current to flow from the input node to the output node. Thus, the bipolar transistor device protects the semiconductor switch device, such as an LDMOS device, against ESD, namely protection against power surges of, say, several amperes in less than 1 usec.

20 Claims, 3 Drawing Sheets

US 7,916,439 B2

SEMICONDUCTOR SWITCH ARRANGEMENT AND AN ELECTRONIC DEVICE

FIELD OF THE INVENTION

The present invention relates to a semiconductor switch arrangement for an electronic device.

BACKGROUND OF THE INVENTION

Semiconductor power switches, for example MOSFET devices, are frequently used to control the flow of current within an electronic device, and in particular to control the supply of current through an inductive load, such as those used in large motors and generators.

By way of illustration a MOSFET device 100 configured to operate as a switch for controlling a current through an inductive load 101 is shown in FIG. 1, where the drain 102 of a MOSFET device 100 is coupled to a voltage supply Vcc via the inductive load 101 and a resistive load 104, the source 105 of the MOSFET device 100 is coupled to ground and the gate 106 of the MOSFET device 100 is coupled to a control signal for switching the MOSFET device on or off (i.e. cause the drain/source to become closed or open circuit).

For an N-channel MOSFET device a positive control voltage will cause the MOSFET device to turn on, for a P-channel MOSFET device a negative control voltage will cause the MOSFET device to turn on.

As is well known to a person skilled in the art, the source and drain of a MOSFET device are formed in a semiconductor material such as silicon, while the gate is formed from a conductive material, such as polycrystalline silicon. The gate is separated from the semiconductor material by an insulating layer, for example silicon dioxide. As such, a MOSFET device is susceptible to damage when a breakdown voltage is applied to the MOSFET.

Two types of voltage damage that can occur to a MOSFET device are electro static discharge ESD and electrical over stress EOS.

In the case of EOS there are three possible failure modes. First, a breakdown voltage of the gate oxide is reached; second, a breakdown voltage of the drain to source BVDSS junction is reached; and third, a maximum junction temperature is reached due to high temperature generated by energy discharges.

In the case of ESD there are two possible failure modes. First, the breakdown voltage of the parasitic bipolar transistor is reached; and second, a breakdown voltage of the gate oxide is reached.

One solution that has been adopted to avoid a voltage that could damage the semiconductor power switch involves the use of a zener clamp 200, where the anode of the zener clamp 200 is coupled to the gate 106 of the MOSFET device 100 and the cathode is coupled to the drain 202, as shown in FIG. 2.

The zener clamp 200 (i.e. zener diode) is chosen to have a breakdown voltage below that of the maximum drain to source voltage. As such, if the zener clamp breakdown voltage is applied to the cathode of the zener clamp current is caused to flow through the zener clamp from the drain to the gate, resulting in the MOSFET device switching on and allowing current to flow from the drain to the source, thereby allowing the voltage at the drain to be reduced and consequently avoid damage to the MOSFET device.

As such, this solution provides a means for clamping the voltage generated at the drain of the MOSFET device to a predetermined voltage (i.e. the breakdown voltage of a zener diode).

However, typically, the breakdown voltage of a zener clamp is relatively low compared to the maximum drain to source voltage of a MOSFET device. As such, to allow an appropriate clamp voltage to be selected a zener clamp comprising a plurality of zener diodes placed in series is needed. Consequently, this solution can result in a voltage clamp circuit being relative large in size. Further, the coupling of zener diodes in series can make it difficult to provide an accurate clamp voltage.

Additionally, as the switching characteristics of the zener diode are slow they are not suitable for providing ESD protection to a MOSFET device. As such, additional ESD protection circuitry is required, thereby resulting in a further increase in size and complexity of a switching circuit.

U.S. Pat. No. 5,812,006 discloses an optimized output clamping structure that includes a power output transistor having a first breakdown voltage and a breakdown structure having a second breakdown voltage coupled to the power output transistor. The second breakdown voltage is less than the first breakdown voltage and follows the first breakdown voltage across all temperature and semiconductor process variations. Notably, the source and drain doping profiles of the power MOS are used to create a switch device (NPN or MOS) in order to protect 'circuits'. Thus, US005812006A discloses a diode that used to clamp a MOSFET, which operates as a diode during electrostatic discharge, thereby failing to protect against ESD. Furthermore, there is no solution to integrate a clamp inside the MOSFET.

It is desirable to provide a semiconductor switch arrangement and an electronic device that provides improved protection against electrostatic discharge.

Statement of Invention

The present invention provides a semiconductor switch arrangement and electronic device as described in the accompanying claims.

This provides the advantage of providing a single voltage clamp device that can provide protection to a semiconductor power switch, for example a MOSFET, insulated gate bipolar transistor IGBT, gate turn off thyristor GTO, or power bipolar transistor, from both electrostatic discharge and electrical over stress (EOS) like energy discharges.

Further, it allows a reduction in die size and improved voltage clamp accuracy.

BRIEF DESCRIPTION OF THE DRAWINGS

The present invention will now be described, by way of example, with reference to the accompanying drawings, in which.

Figure 1:
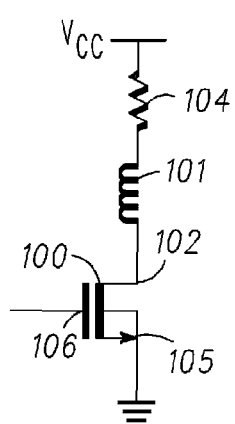
FIG. 1 illustrates a semiconductor switch arrangement as known in the prior art.
Figure 2:
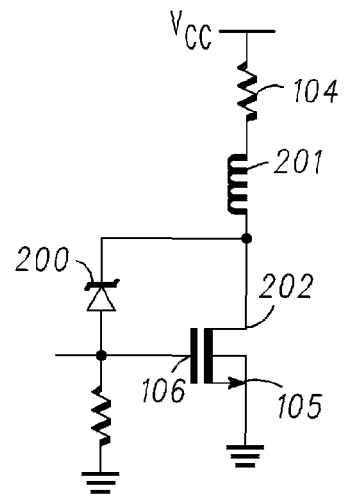
FIG. 2 illustrates a semiconductor switch arrangement incorporating a voltage clamp as known in the prior art.
Figure 3:
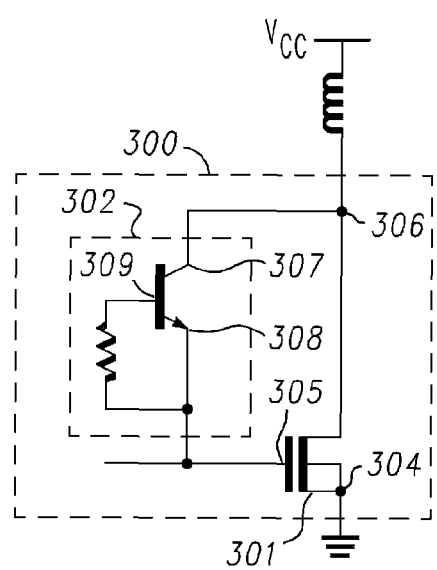
Figure 4:
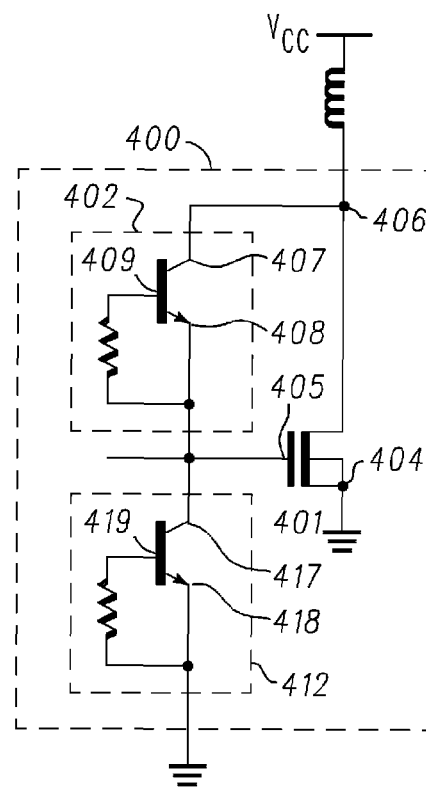
Figure 5:
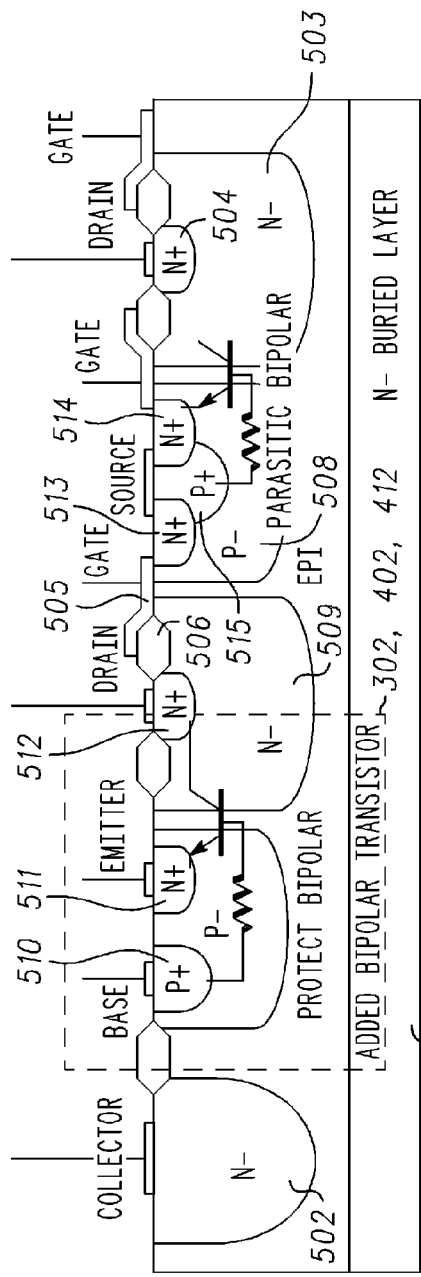
Figure 6:
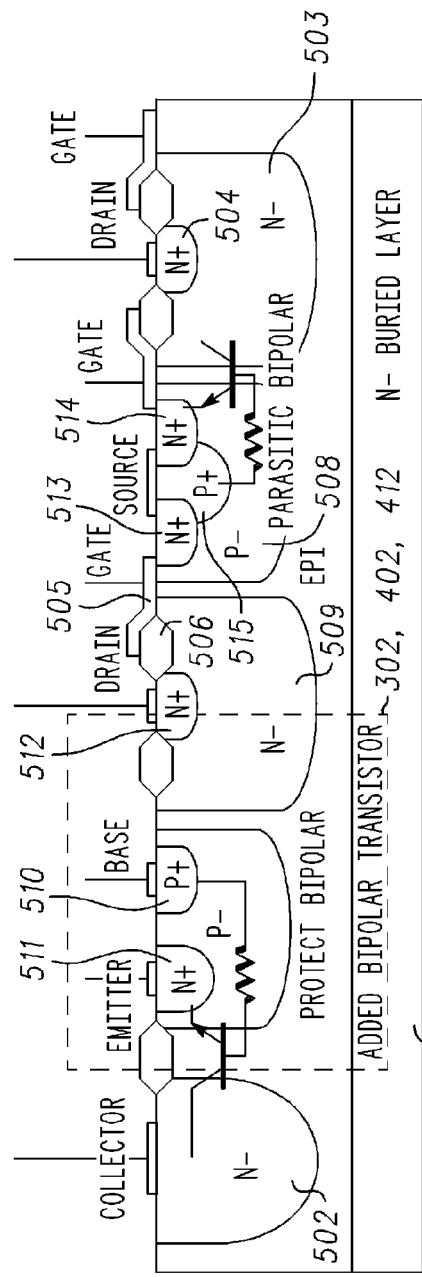
Figure 7:
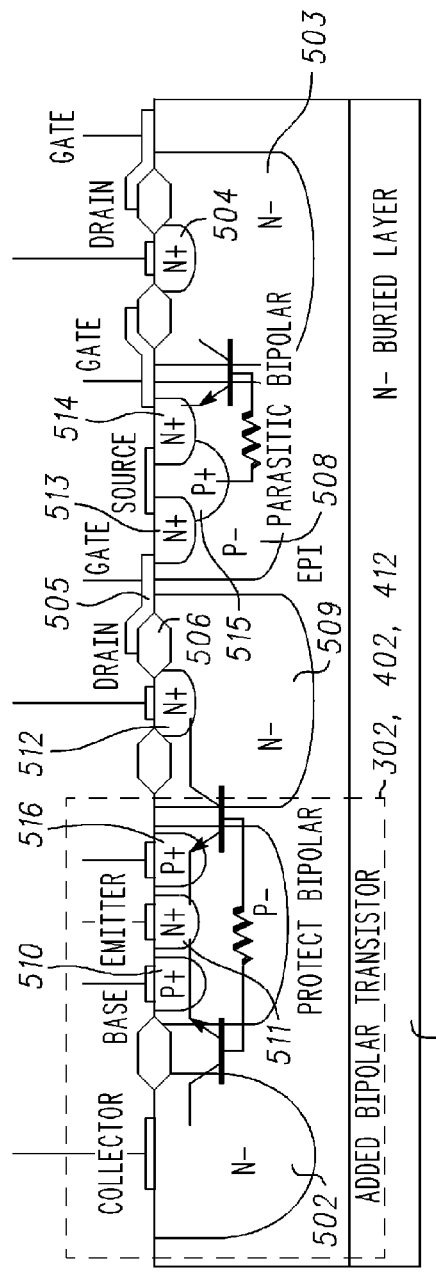
Figure 8:
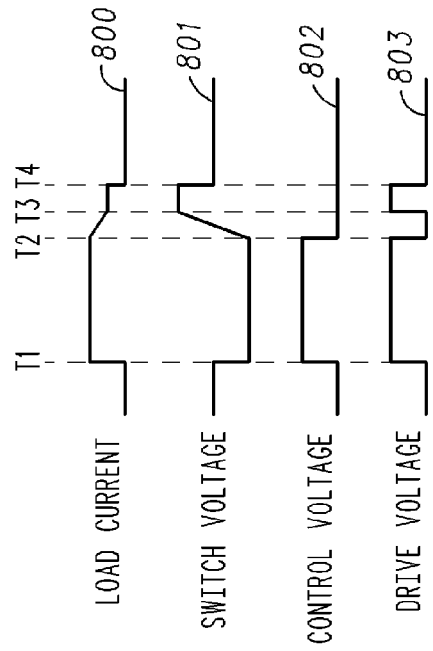

Exemplary embodiments of the present invention will now be described with reference to the accompanying drawings, in which:

FIG. 3 illustrates a semiconductor switch arrangement according to an embodiment of the present invention;

FIG. 4 illustrates a semiconductor switch arrangement incorporating two voltages clamp as known in the prior art;

FIG. 5 illustrates a cross-sectional view of a semiconductor switch according to an embodiment of the present invention;

FIG. 6 illustrates a further cross-sectional view of a semiconductor switch according to an embodiment of the present invention;

FIG. 7 illustrates a yet further cross-sectional view of a semiconductor switch according to an embodiment of the present invention;

FIG. 8 illustrates voltage levels within a semiconductor switch arrangement according to an embodiment of the present invention.

DESCRIPTION OF A PREFERRED EMBODIMENT

FIG. 3 shows a semiconductor switch arrangement 300, having a MOSFET device 301 and a bipolar transistor 302, arranged to control the flow of current in an inductive load 303, for example a motor. The source 304 (i.e. input node) of the MOSFET device 301 is electrically coupled to ground, as is a connection to the substrate of the MOSFET device 301. The gate 305 (i.e. control node) of the MOSFET device 301 is electrically coupled to a control circuit (not shown) for controlling the switching of the MOSFET device 301. The drain 306 of the MOSFET device 301 is coupled to a supply voltage Vcc, via the inductive load 303.

Although the preferred embodiment of the present invention uses a MOSFET device to provide the switching facility, other forms of semiconductor switches could be used, for example, IGBT, GTO, and power bipolar transistors.

The MOSFET device 301 illustrated is an N-type device. However, as would be appreciated by a person skilled in the art, a P-type device could also be used.

Coupled between the drain 306 and gate 305 of the MOSFET device 301 is the bipolar transistor 302, where the collector 307 of the bipolar transistor 302 is electrically coupled to the drain 306 of the MOSFET device 301. The emitter 308 and base 309 of the bipolar transistor 302 are electrically coupled to the gate 305 of the MOSFET device 301. The bipolar transistor 302 illustrated is an npn device. However, as would be appreciated by a person skilled in the art, a pnp device could be used.

The bipolar transistor 302 is arranged to provide voltage clamping to prevent the maximum drain to source voltage of the MOSFET device 301 being exceeded. A first example of when the voltage clamping may be required are when the load current (i.e. the current flowing through the inductive load 303) is switched off by the MOSFET device 301 and a voltage is generated by the inductive load 303 trying to maintain the current through the load. A second example is when an electro-static discharge (ESD) pulse causes a voltage differential to form across the MOSFET device 301. For the purposes of providing ESD protection the bipolar transistor 302 should be configured to be suitable to respond to electro static discharges, for example to have low capacitance and be suitable for high currents.

To determine the voltage clamping requirements for a MOSFET device the energy dissipation specification for the MOSFET device 301 should be known. In knowing the energy dissipation specification for a MOSFET device 301, it is necessary to ensure that the actual energy dissipation is kept within the energy dissipation specification for the MOSFET device 301. The energy dissipation into the MOSFET can be calculated using:

$$E_D = \frac{1}{2}LI^2 \times \frac{Vclamp}{Vclamp - Vcc}$$

where:

L is the inductive load (not shown),
I is the current generated by the inductive load,
Vclamp is the clamp voltage, and
Vcc the voltage supply.

Accordingly, Vclamp should be chosen such that $E_D$ is less than the maximum allowable energy dissipated into the MOSFET device.

With the emitter 308 and base 309 of the bipolar transistor 302 being coupled together the bipolar transistor 302 acts as an insulator for voltages applied to the collector 307 less than a predetermined voltage. However, if the collector or base voltage exceeds a predetermined voltage (i.e. the clamp voltage), the bipolar transistor 302 begins to conduct from the collector 307 to the emitter 308. The base 309 is electrically coupled to the emitter 308 by a resistor than can be formed by diffusion, metal, oxide or ballast for example The breakdown voltage (i.e. clamp voltage) of the bipolar transistor 302 is determined by the distance between the collector 307 and base 309, where increasing the distance results in an increase in breakdown voltage. Alternatively, the breakdown voltage of the bipolar transistor 302 could also be determined by the doping concentration of the collector and the base. Accordingly, the clamp voltage provided by the bipolar transistor 302 can be accurately selected by selecting a suitable distance between the collector 307 and base 309 of the bipolar transistor 302.

In addition to the switch arrangement 300 of FIG. 3, it is envisaged that the gate voltage can be clamped by a second bipolar transistor arrangement 400 as described in FIG. 4. In the transistor arrangement 400 of FIG. 4, the transistor 402 is the same as transistor 302 of FIG. 3. However, coupled between the gate 405 and the source 406 of the MOSFET device 401 is a second bipolar transistor 412, where the collector 417 of the second bipolar transistor 412 is electrically coupled to the gate 405 of the MOSFET device 401. The emitter 418 is electrically coupled to the base 419 of the second bipolar transistor 412.

The transistor 412 is arranged to provide voltage clamping in order to prevent the maximum gate to source voltage of the MOSFET device 401 being exceeded. A first example is when the voltage clamping between the drain port 406 and the gate port 405, as defined by the transistor 402, is reached. Then, a current is able to flow from the transistor 402 to the source 404 through a resistive path thereby creating a voltage drop between the gate port 405 and the source port 406.

A second example is when an electrostatic discharge (ESD) is applied on the drain port 406 of the LDMOS. Here, a transient current is able to flow through the intrinsic drain to gate capacitance and creates a voltage drop between the gate port 405 and the source port 406.

In both of the above examples, the bipolar transistor 412 clamps the voltage between the gate port 405 and the source port 406 during any stress on the drain, as it absorbs a part of the energy. Notably, the energy is dissipated through both clamp structures and the MOSFET device 401.

The second bipolar transistor 412 illustrated is a NPN device. However, as would be appreciated by a person skilled in the art, a PNP device could be used. Transistor 402 can be integrated in the MOSFET in the same way as transistor 302.

In the same manner described previously for clamping the voltage between drain and gate using transistor 402, the clamp voltage between gate and source can also be controlled using the second bipolar transistor 412.

Although FIGS. 3 and 4 show a single MOSFET device, typically to achieve the power levels required a plurality of MOSFET fingers will be used, where a single bipolar transistor, acting as a voltage clamp as described above, may be used to support a number of the MOSFET fingers.

By way of illustration, and with reference to FIG. 5, the operation of the semiconductor switch arrangement 300 will be described with reference to the variations in voltage and current during the switching 'on' and 'off' of the MOSFET device 301 where the bipolar transistor 302 has a breakdown voltage of A1.

Furthermore, although the bipolar transistors 302, 402, 412 can form a separate element that are coupled to the MOSFET device 301 401, it is envisaged that the bipolar transistors 302 402, 412 can be formed from the same integrated circuit die from which the MOSFET device is formed, as illustrated in FIG. 5, FIG. 6 and FIG. 7.

FIG. 5 shows a single integrated circuit die 500 on which is formed the MOSFET device 301, 401 and the bipolar transistors 302, 402, 412 configured as described above.

The integrated circuit die 500 is formed between an N– buried layer 501, a collector N– region 502 and a drain N– region 503 in which an N+ well region 504 is formed. Notably, the N– region under the drain does not contact N– buried layer 501. Such an arrangement enables the inventive concept to be used in an isolated LDMOS implementation if the EPI layer is N doped or none isolated LDMOS if the EPI layer is P doped. Located above the integrated circuit body is a plurality of gate regions 505 isolated from the integrated circuit body via insulation regions 506.

The N– region 502 acts as the collector for the protective bipolar transistor.

The N+ well region 504 acts as a drain for the MOSFET device, say MOSFET 301 or 401 of FIG. 3 or FIG. 4.

Sandwiched between the N– region 502 and the N– region 503 are two P– regions 507, 508 and the second N– region 509. Notably, the preferred embodiment of the present invention can be used in both a NEPI and a PEPI arrangement. In a NEPI arrangement, the LDMOS is not isolated because the drain region N– is connected the NBL through the N– region. In a PEPI arrangement, the LDMOS is isolated because the drain region N– is separated from the NBL by the P–. The preferred embodiment of the present invention operates successfully in both cases.

The P– region 507 closes to the N– region 502 has a P+ well region 510, which forms the base for the protective bipolar transistor (say transistor 302 of FIG. 3 or transistors 402 and/or 412 of FIG. 4), and an N+ well region 511, which forms the emitter for the protective bipolar transistor.

The N– region 509 has an N+ well region 512 that also acts as a drain for the MOSFET device.

The other P– region 508 has two N+ well regions 513, 514 and a P+ well region 515 that act as the source for the MOSFET device.

To configure the semiconductor switch arrangement 300 of FIG. 3 or the alternative semiconductor switch arrangement 400 of FIG. 4, the gate regions 505 are electrically coupled to the P+ and N+ well regions 510, 511 that form the base and emitter, via a first conductive strip, and the N– region 503, 509 is coupled to the N+ well regions 504, 512 that forms the drain, via a second conductive strip.

It is envisaged that the P+ doping 510 that is used to contact the base of the bipolar transistor can be placed between the collector region 502 and N+ emitter region 511, as shown in FIG. 5.

Referring now to FIG. 6, an alternative cross-sectional view of a semiconductor switch 600 implemented on silicon, is illustrated according to the preferred embodiment of the present invention. In the semiconductor switch 600, it is envisaged that the N+ doping 511 that is used to contact the emitter of the bipolar transistor can be placed between the collector region 502 and the P+ base region 510.

Referring now to FIG. 7, a yet further alternative cross-sectional view of a semiconductor switch 700 implemented on silicon, is illustrated according to the preferred embodiment of the present invention. In the semiconductor switch 700, it is envisaged that two P+ regions 510 and 516 may be located at both sides of the emitter 511.

The first waveform 800 shown in FIG. 8 illustrates the current flow through the inductive load 303 and the MOSFET device 301. The second waveform 801 shown in FIG. 8 illustrates the voltage across the MOSFET device 301. The third waveform 802 shown in FIG. 8 illustrates the control voltage applied to the semiconductor switch arrangement 300. The fourth waveform 803 shown in FIG. 8 illustrates the voltage applied to the gate 305 of the MOSFET device 301.

At time T1 the control signal, as shown in the third waveform 802, goes high causing the voltage applied to the gate 305 of the MOSFET device 301 to go high, thereby causing the voltage across the MOSFET device 301 to go low and the load current to go high.

At time T2 the control signal goes low causing the voltage applied to the gate 305 of the MOSFET device 301 to go low, thereby causing the voltage across the MOSFET device 301 to go high and the load current to begin to decrease.

The decrease in load current between times T2 and T3 causes an increase in voltage across the MOSFET device 301, which if left unchecked could reach a value many times higher than Vcc and cause damage to the MOSFET device 301.

At time T3 the voltage across the MOSFET device 301 reaches the breakdown voltage A1 of the bipolar transistor 302. When this occurs current will flow from the load side of the MOSFET device 301 through the bipolar transistor 302 to the gate 305 of the MOSFET device 301 causing the voltage applied to the gate 305 of the MOSFET device 301 to increase, as shown in the fourth waveform 803. In this case, the bipolar transistor 412 described FIG. 4 clamps the voltage between the gate and source terminals between time T3 and T4

At time T3 the current to the MOSFET gate 305 causes the MOSFET device 301 to switch on, allowing the energy stored in the inductive load 303 to flow through the MOSFET device 301 during the time period between T3 and T4.

At time T4 the breakdown voltage goes below A1 causing the bipolar transistor 302 to stop conducting and causing the voltage to the gate 305 of the MOSFET device 301 to drop and the load current to drop to zero.

Based upon a similar process to that described above, the bipolar also provides protection from an ESD pulse by allowing the MOSFET device 301 to be switched on when an ESD pulse causes a voltage to be formed across the semiconductor switch 300 that equals the clamp voltage of the bipolar transistor 302.

Additionally, for an ESD pulse if the control impedance (i.e. the impedance between the gate and the source of the power MOSFET) is very low, the discharge current could flow through the clamp and the low resistance to the ground.

It will be understood that the aforementioned arrangements embodying the inventive concept described above, tend to provide at least one or more of the following advantages:

(i) The bipolar transistor device is arranged to act as a bipolar transistor in a first mode of operation during any ESD and act as a diode for other stress related scenarios in a second mode of operation.
(ii) The inventive concept provides a bipolar transistor device that protects the MOS device, such as an LDMOS device, against ESD, namely protection against power surges of, say, several amperes in less than 1 usec.
(iii) The inventive concept provides a fully integrated solution, requiring a low silicon area, to protect the MOS device from energy and electrostatic discharge.
(iv) The inventive concept describes a solution that allows the energy in the MOSFET device to be dissipated, whilst the clamps used to protect the MOSFET are capable of sustaining some of the energy stress. In this way, both the energy capability and the ESD robustness of the system are fully optimised.

Whilst specific implementations of the present invention have been described, it is clear that one skilled in the art could readily apply further variations and modifications of such implementations within the scope of the accompanying claims.

Thus, a semiconductor switch arrangement and an electronic device have been described to alleviate the aforementioned disadvantages of prior art arrangements and devices.

The invention claimed is:

1. A semiconductor switch arrangement comprising:
a first bipolar transistor and a semiconductor power switch formed in a single integrated circuit die and having an input node, an output node and a control node for allowing a current path to be formed between the input node and the output node, wherein the first bipolar transistor is coupled between the input node and the control node such that upon receiving an electro-static discharge pulse the first bipolar transistor allows a current to flow from the input node to the control node upon a predetermined voltage being exceeded at the input node to allow the control node to cause a current to flow from the input node to the output node wherein the single integrated circuit die comprises an N-buried layer and an N-region under a drain of the semiconductor power switch arranged not to contact with the N-buried layer; and
a second bipolar transistor arrangement to clamp a gate voltage of the semiconductor power switch.

2. A semiconductor switch arrangement according to claim 1, wherein the received ESD pulse causes a voltage to be formed across the semiconductor switch that equals a clamp voltage of the first bipolar transistor thereby switching 'on' the semiconductor switch.

3. A semiconductor switch arrangement according to claim 1, wherein the first bipolar transistor operates as a diode until, in response to the semiconductor switch receiving the electro-static discharge pulse, the diode is arranged to operate as a bipolar transistor.

4. A semiconductor switch arrangement according to claim 1, wherein the semiconductor switch is a MOSFET device, wherein the input node is a drain node, the control node is a gate node and the output node is a source node.

5. A semiconductor switch arrangement according to claim 1, wherein a base and an emitter of the first bipolar transistor are electrically coupled to the control node of the semiconductor switch and a collector of the first bipolar transistor is electrically coupled to the input node of the semiconductor switch.

6. A semiconductor switch arrangement according to claim 1, wherein the first bipolar transistor is an NPN transistor.

7. A semiconductor switch arrangement according to claim 1, wherein a collector of the second bipolar transistor arrangement is electrically coupled to a gate of the semiconductor power switch.

8. A semiconductor switch arrangement according to claim 1, wherein the semiconductor power switch is an LDMOS device.

9. A semiconductor switch arrangement according to claim 1, wherein P+ doping is used to contact a base of the first bipolar transistor.

10. A semiconductor switch arrangement according to claim 9, wherein the P+ doping base of the first bipolar transistor is located between the collector region and an N+ emitter region of the first bipolar transistor.

11. A semiconductor switch arrangement according to claim 9, wherein N+ doping is used to contact the emitter of the first bipolar transistor and the emitter is located between a N-collector region and the P+ base region.

12. A semiconductor switch arrangement according to claim 9, wherein P+ regions of the base of the first bipolar transistor are located at both sides of the emitter.

13. An electronic device having a semiconductor switch arrangement according to claim 1, wherein the semiconductor switch arrangement is arranged to control the passing of current through a load by means of a control signal applied to the control node of the semiconductor switch, wherein if a voltage is formed at the input node of the semiconductor switch that exceeds the predetermined voltage the current flow from the input node to the control node causes current generated by the load to flow from the input node to the output node.

14. An electronic device having a semiconductor switch arrangement according to claim 1, wherein the semiconductor switch arrangement is arranged to control the passing of current through a load by utilization of a control signal applied to the control node of the semiconductor switch, wherein if a voltage is formed at the input node of the semiconductor switch that exceeds the predetermined voltage the current flow from the input node to the control node causes current generated by the load to flow from the input node to the output node.

15. A semiconductor switch arrangement according to claim 2, wherein the first bipolar transistor operates as a diode until, in response to the semiconductor switch receiving the electro-static discharge pulse, it is arranged to operate as a bipolar transistor.

16. A semiconductor switch arrangement according to claim 2, wherein the semiconductor switch is a MOSFET device, wherein the input node is a drain node, the control node is a gate node and the output node is a source node.

17. A semiconductor switch arrangement according to claim 3, wherein the semiconductor switch is a MOSFET device, wherein the input node is a drain node, the control node is a gate node and the output node is a source node.

18. A semiconductor switch arrangement according to claim 1, wherein P+ regions of the base of the first bipolar transistor are located at both sides of the emitter.

19. A semiconductor switch arrangement comprising:
a bipolar transistor and a semiconductor power switch formed in a single integrated circuit die and having an input node, an output node and a control node for allowing a current path to be formed between the input node and the output node, wherein the bipolar transistor is coupled between the input node and the control node such that upon receiving an electro-static discharge pulse the bipolar transistor allows a current to flow from the input node to the control node upon a predetermined voltage being exceeded at the input node to allow the control node to cause a current to flow from the input node to the output node wherein the single integrated circuit die comprises an N-buried layer and an N-region under a drain of the semiconductor power switch arranged not to contact with the N-buried layer, and wherein a base of the bipolar transistor is coupled to an emitter of the bipolar transistor by a resistor, the emitter of the bipolar transistor is electrically coupled to the control node of the semiconductor switch, and a collector of the bipolar transistor is electrically coupled to the input node of the semiconductor switch.

20. A semiconductor switch arrangement according to claim 19, wherein a gate voltage of the semiconductor power switch is clamped by a second bipolar transistor arrangement.

* * * * *